US006671845B1

(12) United States Patent
Atmeh

(10) Patent No.: US 6,671,845 B1
(45) Date of Patent: Dec. 30, 2003

(54) PACKET-BASED DEVICE TEST SYSTEM

(75) Inventor: Elias M. Atmeh, San Jose, CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/421,784

(22) Filed: Oct. 19, 1999

(51) Int. Cl.[7] .......................... G01R 31/28; G06F 11/00; G11C 29/00
(52) U.S. Cl. .......................... 714/738; 714/718; 714/743
(58) Field of Search .............................. 714/718, 720, 714/722, 738, 743; 365/200, 201

(56) References Cited

U.S. PATENT DOCUMENTS

| 4,165,092 | A |   | 8/1979  | Herlein |           |
|-----------|---|---|---------|---------|-----------|
| 4,502,127 | A |   | 2/1985  | Garcia et al. |     |
| 4,511,846 | A |   | 4/1985  | Nagy et al. |       |
| 4,635,256 | A |   | 1/1987  | Herlein |           |
| 4,675,562 | A |   | 6/1987  | Herlein |           |
| 4,789,835 | A |   | 12/1988 | Herlein |           |
| 4,820,944 | A |   | 4/1989  | Herlein et al. |    |
| 4,837,521 | A |   | 6/1989  | Herlein et al. |    |
| 4,849,702 | A |   | 7/1989  | West et al. |       |
| 4,862,460 | A | * | 8/1989  | Yamaguchi | 714/743 |
| 5,018,145 | A | * | 5/1991  | Kikuchi et al. | 714/743 |
| 5,265,102 | A | * | 11/1993 | Saito | 714/743 |
| 5,363,382 | A | * | 11/1994 | Tsukakoshi | 714/719 |
| 5,430,400 | A |   | 7/1995  | Herlein et al. |    |
| 5,790,559 | A | * | 8/1998  | Sato | 714/720 |
| 5,796,748 | A | * | 8/1998  | Housako et al. | 714/720 |
| 5,883,905 | A | * | 3/1999  | Eastburn | 714/738 |
| 5,946,247 | A |   | 8/1999  | Osawa et al. |     |
| 6,148,424 | A | * | 11/2000 | Tsutsui | 714/720 |
| 6,154,715 | A | * | 11/2000 | Dinteman et al. | 702/120 |
| 6,181,616 | B1 | * | 1/2001 | Byrd | 365/201 |
| 6,247,153 | B1 | * | 6/2001 | Jeon et al. | 714/718 |
| 6,321,356 | B1 | * | 11/2001 | Snodgrass et al. | 714/738 |
| 6,349,399 | B1 | * | 2/2002 | Manning | 714/744 |
| 6,363,022 | B2 | * | 3/2002 | Tsuto | 365/201 |
| 6,374,376 | B1 | * | 4/2002 | Byrd | 714/718 |
| 6,389,525 | B1 | * | 5/2002 | Reichert et al. | 711/217 |

FOREIGN PATENT DOCUMENTS

| EP | 1141736 A1 | * | 10/2001 | ....... G01R/31/3181 |
| JP | 63191078 A | * | 8/1988  | ........... G01R/31/28 |

OTHER PUBLICATIONS

Hilliges, K. and Sundermann, J.; A true testprocessor–per–pin algorithmic pattern generator; Records of the 1996 IEEE International Workshop on Memory Technology, Design and Testing, pp.: 103–109.*
Press Release, nptest, http://www.nptest.com/newsEvents/030999_fully_comp_rdx2200.htm,Mar. 9, 1999 (3 pages).
Reed Electronics Group, "Electronic News", article entitled "Schlumberger ATE Enters RambusTest Fray", http://www.e–insite.net/electronicnew, Mar. 15, 1999 (3 pages).

* cited by examiner

Primary Examiner—David Ton
Assistant Examiner—Joseph D. Torres
(74) Attorney, Agent, or Firm—Dorsey & Whitney LLP

(57) ABSTRACT

A packet generator that increases the output speed of column and row addresses and data provided by a semiconductor device test system. The packet generator receives column and row addresses and data from a conventional algorithmic pattern generator (APG) and generates column and row addresses and data in packet form, thereby allowing communications with a packet-based device under test, such as a memory. The packet generator further provides variable time spacing between column and row addresses and data packets. Thereby, the packet generator advantageously allows testing of memory devices that require signal inputs at a higher rate than a conventional APG can provide.

3 Claims, 7 Drawing Sheets

ROWA — 8 bits/Stream

| | | | | | | | | Stream |
|---|---|---|---|---|---|---|---|---|
| DR4T | DR2 | BR0 | BR3 | RsvR | R8 | R5 | R2 | 2 |
| DR4F | DR1 | BR1 | RsvB | RsvR | R7 | R4 | R1 | 1 |
| DR3 | DR0 | BR2 | RsvB | AV=1 | R6 | R3 | R0 | 0 |

ROWR

| | | | | | | | | Stream |
|---|---|---|---|---|---|---|---|---|
| DR4T | DR2 | BR0 | BR3 | ROP10 | ROP8 | ROP5 | ROP2 | 2 |
| DR4F | DR1 | BR1 | RsvB | ROP9 | ROP7 | ROP4 | ROP1 | 1 |
| DR3 | DR0 | BR2 | RsvB | AV=0 | ROP6 | ROP3 | ROP0 | 0 |

8 bits

COLC

| | | | | | | | | Stream |
|---|---|---|---|---|---|---|---|---|
| DC4 | S=1 | ****** | ****** | ****** | ****** | RsvC | C4 | 4 |
| DC3 | ****** | ****** | ****** | ****** | ****** | C5 | C3 | 3 |
| DC2 | COP1 | ****** | ****** | ****** | RsvB | BC2 | C2 | 2 |
| DC1 | COP0 | ****** | ****** | ****** | RsvB | BC1 | C1 | 1 |
| DC0 | COP2 | ****** | ****** | COP3 | BC3 | BC0 | C0 | 0 |

8 bits

COLM

| | | | | | | | | Stream |
|---|---|---|---|---|---|---|---|---|
| | | MA7 | MA5 | MA3 | MA1 | | | 4 |
| | M=1 | MA6 | MA4 | MA2 | MA0 | | | 3 |
| | | MB7 | MB4 | MB1 | | | | 2 |
| | | MB6 | MB3 | MB0 | | | | 1 |
| | | MB5 | MB2 | | | | | 0 |

8 bits

COLX

| | | | | | | | | Stream |
|---|---|---|---|---|---|---|---|---|
| | | DX4 | XOP4 | RsvB | BX1 | | | 4 |
| | M=0 | DX3 | XOP3 | RsvB | BX0 | | | 3 |
| | | DX2 | XOP2 | BX3 | | | | 2 |
| | | DX1 | XOP1 | BX2 | | | | 1 |
| | | DX0 | XOP0 | | | | | 0 |

8 bits

*FIG. 1B* (Prior Art)

PACKET-BASED DEVICE TEST SYSTEM

FIELD OF THE INVENTION

The present invention is directed to a system for testing memory devices.

RELATED ART

It is well known to use a test system to test the reliability of a semiconductor device, such as a conventional dynamic random access memory (DRAM) or static random access memory (SRAM). The conventional test system typically provides a test signal pattern (so called "test vector") to a semiconductor device under test ("DUT") and compares an output signal from the DUT with an expected signal to determine whether the DUT functions correctly. For exemplary test systems, see, for example, U.S. Pat. No. 5,946,247 to Osawa et al.; U.S. Pat. No. 4,862,460 to Yamaguchi; and U.S. Pat. No. 4,502,127 to Garcia et al, which are incorporated herein by reference in their entirety.

Recently introduced memory devices, such as Direct RDRAM™ from RAMBUS of Mountain View, Calif., use variably time spaced, "packet" based address and data communications. A "packet" includes multiple "streams" transmitted in parallel, where each stream is 8 serial ordered bits. For a description of Direct RDRAM™, see the Direct RDRAM™ Datasheet available from RAMBUS, which is incorporated by reference herein in its entirety. Herein, "Direct RDRAM™" means any device compatible with the Direct RDRAM™ such as Synclink. Such address and data packet communications further include interspersed instructions. Thus, to test such recent memory systems, a test system must provide such variably time spaced and instruction-interspersed, packet based communications.

FIG. 1A depicts in a block diagram form a Direct RDRAM™ device 100. Direct RDRAM™ device 100 includes distinct terminals labeled ROW, COLUMN, DATA0, and DATA1. Commands "ROWA" and "ROWR" are input to terminal ROW. Commands "COLC/M" and "COLC/X" are input to terminal COLUMN. Commands "DQA" and "DQB" are input to respective terminals DATA0 and DATA1. Direct RDRAM™ uses the packet-based commands "ROWA" and "ROWR" for row identification, "COLC/M" and "COLC/X" for column identification, and a combination of. "DQA" and "DQB" for data specification.

FIG. 1B depicts the bit designations of commands "ROWA", "ROWR", "COLC", "COLX" and "COLM". Command "COLC/X" is a combination of commands "COLC" and "COLX" whereas "COLC/M" is a combination of commands "COLC " and "COLM". Commands "ROWA" and "ROWR" each include three streams (numbered 0 to 2), each stream being 8 bits in serial order. As shown, command "ROWA" includes bits "DR4T", "DR4F", "DR0" to "DR3", "BR0" to "BR3", 2 bits of "RsvB", 2 bits of "RsvR", "AV", and "R0" to "R8". Direct RDRAM™ defines "DR4T" and "DR4F" as bits for framing (recognizing) a "ROWA" or "ROWR" command; "DR0" to "DR3", "DR4T", and "DR4F" as a device address for "ROWA" and "ROWR" commands; "BR0" to "BR3" as a bank address for "ROWA" and "ROWR" commands; "AV" as a bit for selecting between "ROWA" and "ROWR" commands; and "R0" to "R8" as a row address for the "ROWA" and "ROWR" commands. The two bits of "RsvB" are reserved for future bank address extensions whereas the two bits of "RsvR" are reserved for future row address extensions.

Command "ROWR" is used to precharge address specified memory cells, which will be accessed subsequently. The bit designations of command "ROWR" are the same as those of command "ROWA" except bit AV is 0.

As shown in FIG. 1B, command "COLC" includes bits "S", "DC0" to "DC4", "C0" to "C5", "RsvC", "BC0" to "BC3", 2 bits of "RsvB", and "COP0" to "COP3". Direct RDRAM™ defines "S" as a bit for framing (recognizing) the "COLC" command; "DC0" to "DC4" as a device address for the "COLC" command; "C0" to "C5" as a column address for the "COLC" command; "RsvC" as a bit reserved for future expansion of the column address; "BC0" to "BC3" as a bank address for the "COLC" command; 2 bits of "RsvB" as bits reserved for future expansion of the bank address; and "COP0" to "COP3" as used to specify read, write, precharge, and power management functions.

As shown in FIG. 1B, command "COLC" includes undefined bits, shown as asterisk. Commands "COLX" and "COLM" are inserted into the undefined bits of command "COLC" to form respective commands "COLC/X" and "COLC/M". Commands "COLC/X" and "COLC/M" each include five streams (numbered 0 to 4), each being 8 bits in serial order.

Command "COLC/X" is used to specify an independent precharge command and for housekeeping and power management. Command "COLC/X" includes bits "M", "DX0" to "DX4", "XOP0" to "XOP4", "BX0" to "BX3", and 2 "RsvB" bits. Direct RDRAM™ defines "M=0" as identifying the "COLC/X" command; "DX0" to "DX4" as specifying the device address for the "COLC/X" command; "XOP0" to "XOP4" as an opcode field for the "COLC/X" command to specify precharge and power management functions; "BX0" to "BX3" as a bank address for the "COLC/X" command; and the 2 "RsvB" bits as reserved for expansion of the bank address.

Command "COLC/M" is used to specify byte mask control. Command "COLC/M" includes bits "M", "MA0" to "MA7 ", and "MB0" to "MB7". Direct RDRAM™ defines "M=1" as identifying the "COLC/M" command; "MA0" to "MA7" as byte mask write control bits; and "MB0" to "MB7" as byte mask write control bits.

Direct RDRAM™ defines data commands "DQA" and "DQB" each as nine streams (numbered 0 to 8), each stream including 8 bits in serial order. Commands "DQA" and "DQB" include only data.

FIG. 1C schematically depicts an exemplary sequence of packet-based commands "ROWA", "ROWR", "COLC/M", "COLC/X", "DQA", and "DQB". The time spacing between the start and ending of sequential, packet-based commands is variable.

One conventional test system uses multiple accelerated APGs (algorithmic pattern generators) to generate address and data commands at a rate required by a Direct RDRAM™ compatible DUT. For descriptions of exemplary APGs, see U.S. Pat. No. 5,946,247 to Osawa et al.; U.S. Pat. No. 4,862,460 to Yamaguchi; and U.S. Pat. No. 4,502,127 to Garcia et al, which are incorporated by reference herein in their entirety. However, such accelerated APGs are expensive. Further, complex logic circuitry is required to form commands from the address and data from the multiple APGs thereby making the test system difficult for a tester to use.

Thus what is needed is a test system that provides variably time spaced, packet based communications to test DUTs without use of multiple accelerated APGs.

SUMMARY

An embodiment of the present invention includes a packet generator that generates packet-based address and data commands to a device under test (DUT). In one embodiment, the packet generator receives column and row addresses and data from a single conventional (non-accelerated) algorithmic pattern generator (APG) and generates column and row addresses and data in packet form, thereby allowing communications with a packet-based device, such as a memory system. The packet generator further provides variable time spacing between column and row addresses and data packets without modification of a conventional timing and formatting circuitry. Thereby, the packet generator advantageously allows testing of memory DUTs that require signal inputs at a higher rate than a conventional APG can provide.

Thereby an embodiment of the present invention includes a method of providing packet-based address and data commands to a device under test (DUT), the method including the acts of: providing a data at a data rate; providing addresses at an address rate; providing user-specified instructions; providing to the DUT address packets that include the addresses and the user-specified instructions at a rate faster than the address rate; and providing to the DUT data packets that include the data and the user-specified instructions at a rate faster than the data rate.

Various embodiments of the present invention will be more fully understood in light of the following detailed description taken together with the accompanying drawings.

BRIEF DESCRIPTION OF THE DRAWINGS

FIG. 1B depicts exemplary multiple stream commands.

Herein with respect to FIGS. 1A and 2 to 6, each arrow terminated line represents a signal path that transmits a single bit or multiple bits.

Note that use of the same reference numbers in different figures indicates the same or like elements.

DETAILED DESCRIPTION

Figure 2:
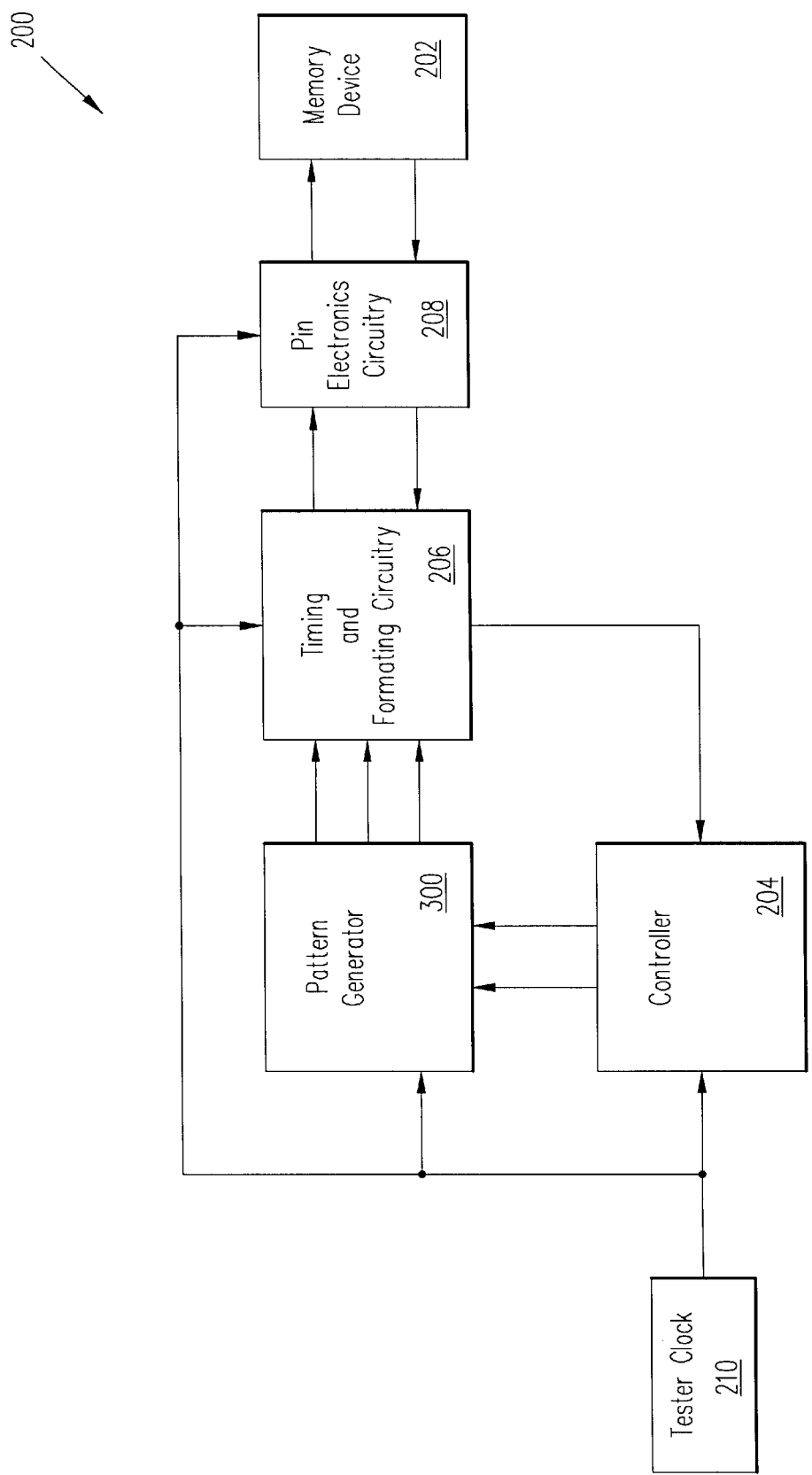
FIG. 2 depicts an exemplary test system that uses the packet generator in accordance with an embodiment of the present invention.
Figure 3:
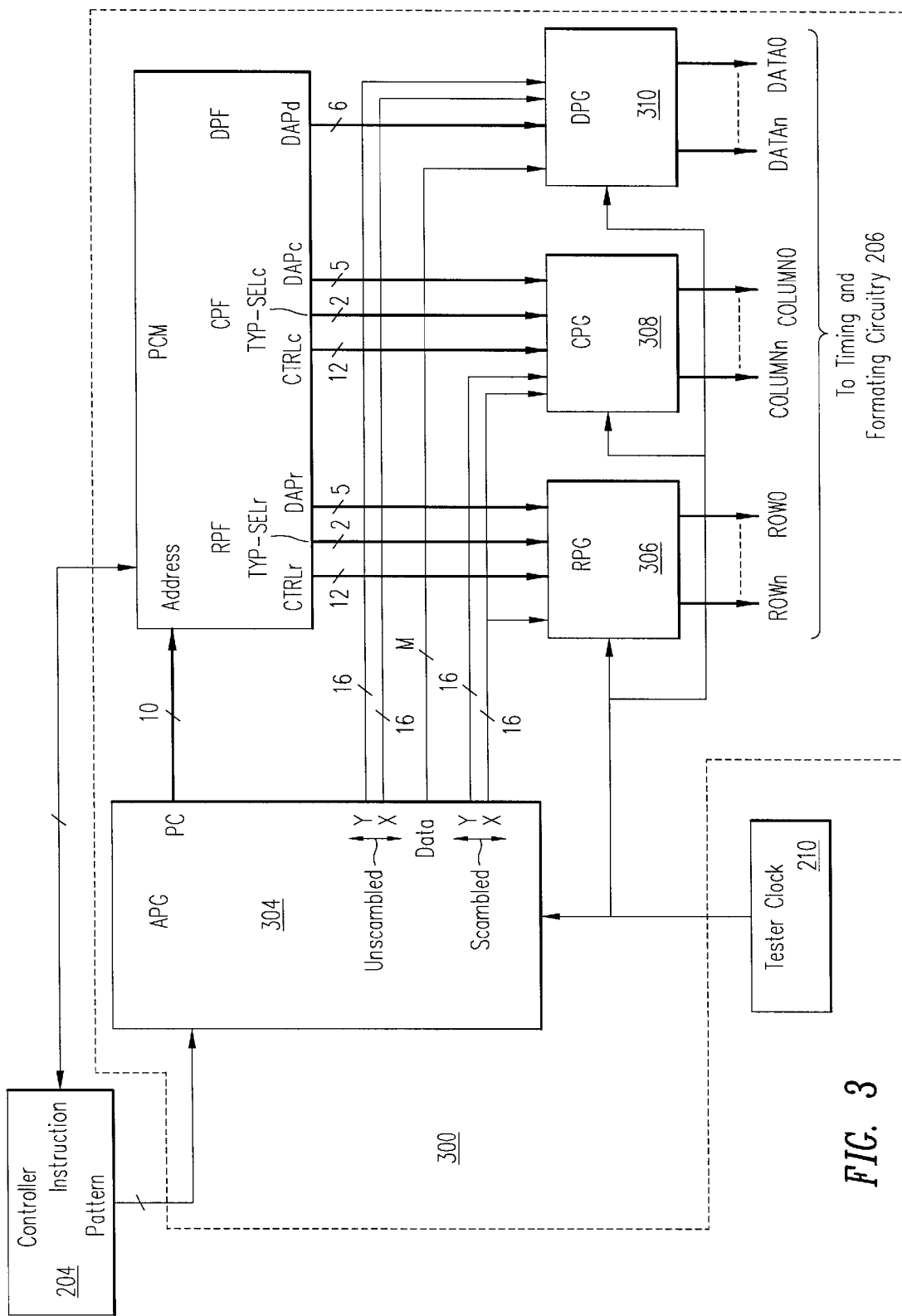
FIG. 3 depicts a packet generator in accordance with an embodiment of the present invention.

FIG. 2 depicts in a block diagram an exemplary test system 200 that includes the packet generator 300, which is in accordance with an embodiment of the present invention and described in more detail with respect to FIG. 3. All elements of FIG. 2 except packet generator 300 are conventional. Test system 200 is used to test a memory DUT 202, such as a Direct RDRAM™ memory device, responsive to packet based communications having interspersed instructions, address, and/or data. Herein "signal" means any or a combination of an instruction, data, or an address.

A conventional controller 204, such as a personal computer, controls the output of the packet generator 300 and provides the status of the memory DUT 202. The relationship between the controller 204 and packet generator 300 is described in more detail later.

Timing and formatting circuitry 206 converts bits, input in parallel, into serial ordered bits. For examples of timing and formatting circuitry 206, see the following United States Patents issued to Herlein, et al., which are incorporated by reference herein in their entirety: U.S. Pat. Nos. 5,430,400; 4,849,702; 4,837,521; 4,820,944; 4,789,835; 4,675,562; 4,635,256; 4,511,846; and 4,165,092.

Pin electronics circuitry 208 conventionally converts binary values from the timing and formatting circuitry 206 into voltage values which are applied to the pins (terminals) of memory DUT 202. Conversely, the pin electronics circuitry 208 converts voltage values output from the memory DUT 202 into binary values and provides the binary values to the timing and formatting circuitry 206. The controller 204 reads the results of the test and displays pass/fail information to the user.

Packet Generator

FIG. 3 depicts in more detail a block diagram of a packet generator 300 in accordance with an embodiment of the present invention. Packet generator 300 includes a packet control memory (PCM) 302, an algorithmic pattern generator (APG) 304, row packet generator (RPG) 306, column packet generator (CPG) 308, and data packet generator (DPG) 310. When memory DUT 202 is a Direct RDRAM™, multiple mostly similar replicas of RPG 306, CPG 308, and DPG 310 are used to generate packet based commands described with respect to FIG. 1B for the Direct RDRAM™.

The PCM 302 is a conventional instruction memory that provides "group instructions" to the RPG 306, CPG 308, and DPG 310. Each group instruction defines separate time offset instructions of DAPr, DAPc, and DAPd, that specify either a time delay before a respective address, column, or data packet is transmitted. Each group instruction further defines instructions CTRLr, CTRLc, TYP-SELr, and TYP-SELc. Exemplary uses of instructions CTRLr, CTRLc, TYP-SELr, and TYP-SELc are described in more detail later. The controller 204 supplies the group instructions to be stored in the PCM 302.

Instructions CTRLr and the scrambled X are interspersed into commands "ROWA" and "ROWR". Instruction CTRLr includes bits "AV", "DR4T", "DR4F", and "DR0" to "DR3" whereas the scrambled X includes "R0" to "R8", "BR0" to "BR3", "RsvR", and "BR".

Instructions CTRLc and the scrambled Y are interspersed into command "COLC/M". Instruction CTRLc includes bits "S", "DC0" to "DC4", "N", "MA0" to "MA7", and "MB0" to "MB7", whereas the scrambled Y includes "C0" to "C5", "BC0" to "BC3", "COP0" to "COP3", 2 bits of "RsvB", and "RsvC".

Instructions CTRLc, the scrambled X, and the scrambled Y are interspersed into command "COLC/X". Instruction CTRLc includes bits "S", "DC0" to "DC4", "M", and "DX0" to "DX4"; the scrambled Y includes "C0" to "C5", "BC0" to "BC3", "COP0" to "COP3", 2 bits of "RsvB", and "RsvC"; and the scrambled X includes "XOP0" to "XOP4" and "BX0" to "BX3".

Note that use of instructions DAPr, DAPc, and DAPd to delay the beginning of commands uses less circuitry than use of timing and formatting circuitry 206 to delay previously output commands.

The mostly conventional APG 304 provides addresses and accompanying data to the RPG 306, CPG 308, and DPG 310 every clock cycle of the tester clock signal of tester clock 210. In this embodiment, the controller 204 loads the test pattern into the instruction memory of the APG 304. The APG 304 generates addresses and M bits of data which respectively specify addresses of memory cells of the memory DUT 202 and data to be stored in such addresses. In this embodiment, each address defines a row and column of a memory cell of memory DUT 202.

In one embodiment, the APG 304 provides row (X) and column (Y) addresses and M bits of data to the DPG 310. The APG 304 provides "scrambled" row and column addresses to the CPG 308 whereas the APG 304 provides "scrambled" row addresses to the RPG 306. Scrambled row and column addresses are versions of the row and column addresses which have been modified to match the specific address topology (arrangement) of memory cells of the memory DUT 202.

The APG 304 further outputs a program counter (PC) which is used to address the PCM 302. The PCM 302 outputs a group instruction associated with data and addresses output by the APG 304. The PCM 302 outputs a group instruction every clock cycle of the tester clock signal of tester clock 210.

RPG

Figure 4:
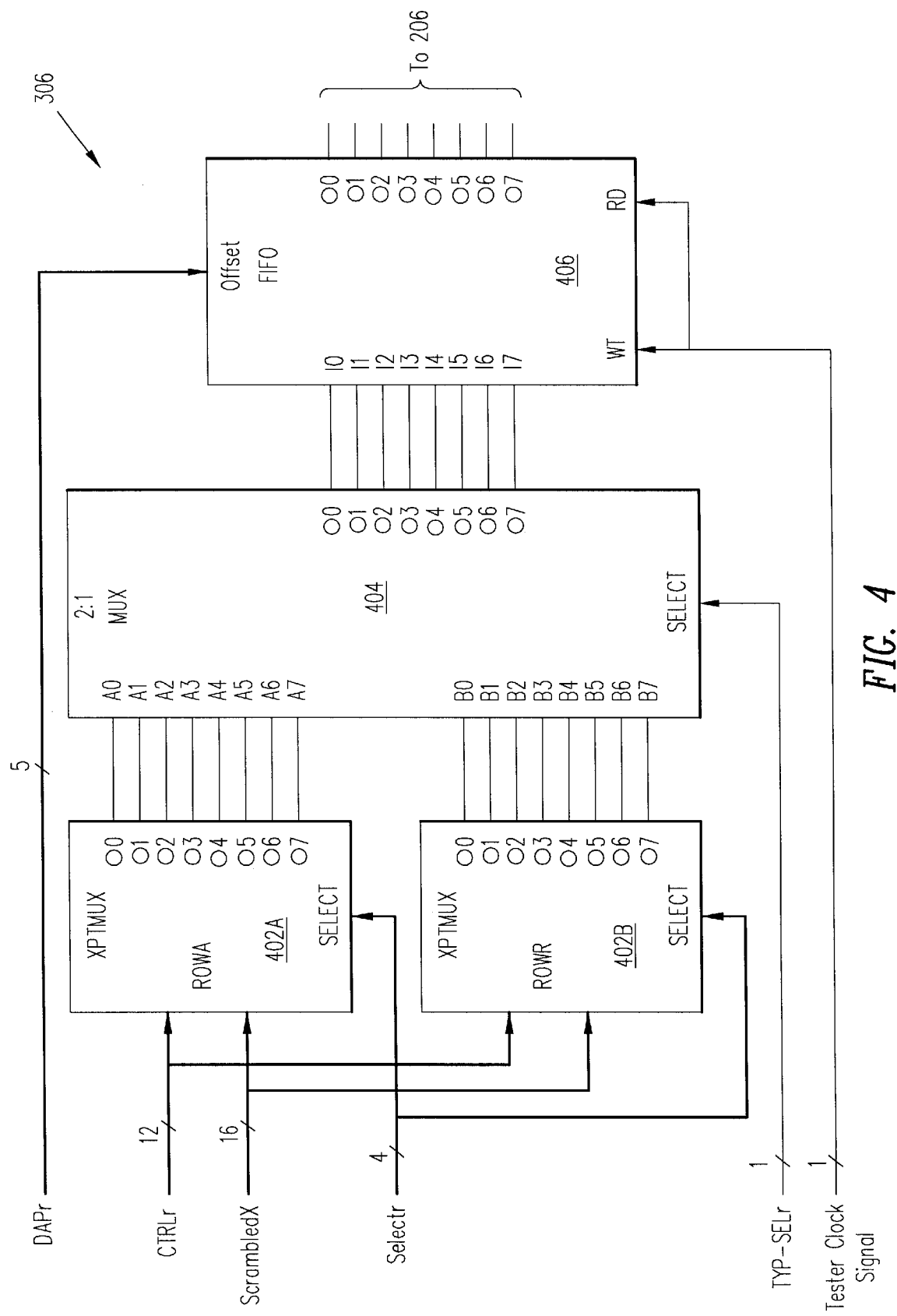
FIG. 4 depicts an embodiment of RPG of FIG. 3.

FIG. 4 depicts in a block diagram an embodiment of RPG 306 used to generate a single stream of the three stream commands "ROWA" or "ROWR" (FIG. 1B). To generate all three streams of commands "ROWA" or "ROWR", RPG 306 is replicated three times but the replicas differ only in the configurations of cross point multiplexers 402A and 402B. The three mostly similar replicas of RPG 308 provide parallel ordered versions of streams of command "ROWA" or "ROWR" to the timing and formatting circuitry 206. The timing and formatting circuitry 206 converts the parallel ordered versions of the streams into serial order and thereby outputs command "ROWA" or "ROWR".

Advantageously, the mostly similar replicas of the RPG 306 increase the speed that row addresses are output above that at which the APG 304 provides row addresses. Thereby multiple, speed enhanced APGs are not needed. Further, the mostly similar replicas of the RPG 306 control variable timing output of commands "ROWA" and "ROWR".

RPG 306 includes conventional cross point multiplexers 402A and 402B. A cross point multiplexer has the capability to assign any input signal to any output or multiple outputs. Each cross point multiplexer 402A and 402B is coupled to receive the scrambled row (X) address (from the APG 304 of FIG. 3) and a CTRLr instruction (from the PCM 302 of FIG. 3). Each cross point multiplexer 402A and 402B is coupled to receive instruction SELECTr from the controller 204 (FIG. 2). The four bit instruction SELECTr controls cross point multiplexers 402A and 402B and specifies a relationship between the bits output by and input to the cross point multiplexers 402A and 402B.

In one embodiment, the associations between output and input bits for each cross point multiplexer 402A and 402B are different for the same value of instruction SELECTr. The difference is because output signals from each of cross point multiplexer 402A and 402B correspond to different streams of commands "ROWA" and "ROWR". The output bits are described earlier with respect to FIG. 1B. Note that each of cross point multiplexers 402A and 402B outputs a parallel order version of a distinct stream of command "ROWA" and "ROWR".

The output signals from cross point multiplexers 402A and 402B are provided as input signals to a conventional multiplexer 404. The output signal of multiplexer 404, i.e., either the output signal of cross point multiplexer 402A or 402B, is controlled by instruction TYP-SELr from the PCM 302. When memory DUT 202 is a Direct RDRAM™, instruction TYP-SELr selects between output of a distinct stream of the "ROWA" or "ROWR" command.

The output signal from multiplexer 404 is provided to a conventional first-in-first-out (FIFO) memory device 406. Instruction DAPr (from the PCM 302) specifies the number of clock cycles of the tester clock signal of tester clock 210 (FIG. 2) to count prior to outputting the output signal from multiplexer 404. The tester clock signal is coupled to input terminals WT and RD of the FIFO device 406. The input to the WT terminal .controls when data from the MUX 404 is loaded into the FIFO memory device 406, whereas the input to the RD terminal controls when the FIFO memory device 406 outputs data. FIFO memory device 406 outputs eight bits of data in parallel.

CPG

Figure 5:
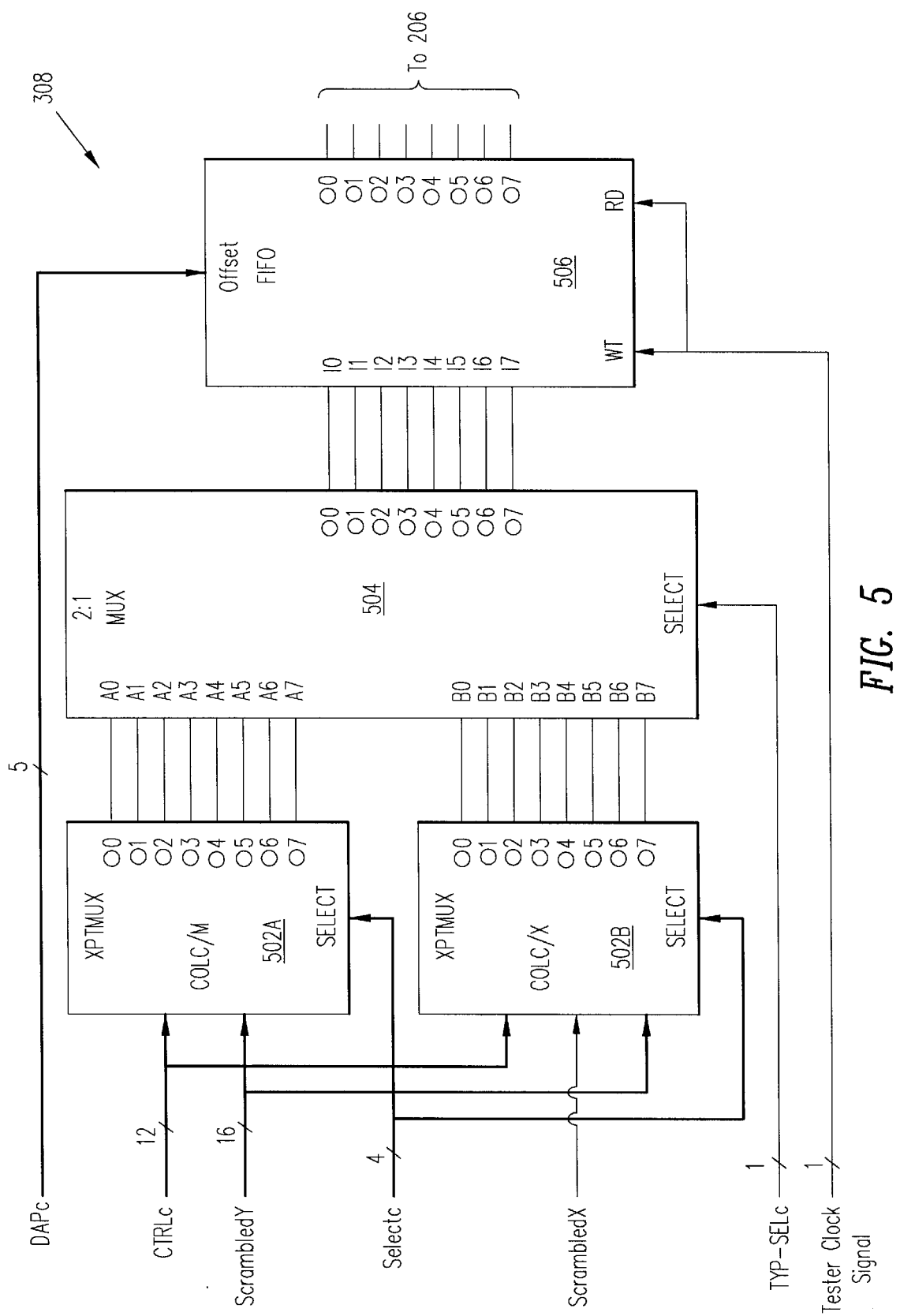
FIG. 5 depicts an embodiment of the CPG of FIG. 3.

FIG. 5 depicts in a block diagram an embodiment of the CPG 308 that is structurally similar to the embodiment of RPG 306 described with respect to FIG. 4. When memory DUT 202 is a Direct RDRAM™, each CPG 308 generates a distinct stream of the five stream commands "COLC/M" or "COLC/X". To generate all five streams of command "COLC/M" or "COLC/X", CPG 308 is replicated five times but the replicas differ only in the configurations of cross point multiplexers 502A and 502B. The five mostly similar replicas of CPG 308 provide parallel ordered versions of streams of command "COLC/M" or "COLC/X" to the timing and formatting circuitry 206. The timing and formatting circuitry 206 converts the parallel ordered versions of the streams into serial order and thereby outputs command "COLC/M" or "COLC/X".

Advantageously, the multiple mostly similar replicas of the CPG 308 increase the speed that column addresses are output above that at which the APG 304 provides column addresses. Thereby multiple, speed enhanced APGs are not needed. Further, the multiple mostly similar replicas of the CPG 308 support variable timing output of commands.

Cross point multiplexer 502A is coupled to receive the scrambled column (Y) and a CTRLc instruction. Cross point multiplexer 502B is coupled to receive the scrambled column (Y) and row (X) addresses and a CTRLc instruction. Each of cross point multiplexers 502A and 502B is coupled to receive instruction SELECTc from the controller 204 (FIG. 2). The four bit instruction SELECTc controls cross point multiplexers 502A and 502B and specifies a relationship between the bits output by and input to the cross point multiplexers 502A and 502B.

The output signals of cross point multiplexers 502A and 502B are provided as input signals to a conventional multiplexer 504. The output signal of multiplexer 504, i.e., either the output signal of either cross point multiplexer 502A or 502B, is controlled by instruction TYP-SELc from the PCM 302. The instruction TYP-SELc selects-between output of a distinct stream of the five stream commands "COLC/M" and "COLC/X".

In one embodiment, the associations between output and input bits for each of cross point multiplexers 502A and 502B are different for the same value of instruction SELECTc. The difference is because output signals from each of cross point multiplexers 502A and 502B correspond to different stream of commands "COLC/M" and "COLC/X". The output bits are described earlier with respect to FIG. 1B. Note that each of cross point multiplexers 502A and 502B outputs a parallel order version of a distinct stream of command "COLC/M" or "CObLC/X".

The output signal of multiplexer 504 is provided to a conventional first-in-first-out (FIFO) 8 bit wide memory device 506. Instruction DAPc (from the PCM 302) specifies the number of clock cycles of the tester clock signal of tester clock 210 (FIG. 2) to count prior to outputting the output signal from multiplexer 504. The tester clock signal is coupled to input terminals WT and RD of the FIFO memory device 506. The input to the WT input terminal controls when data from the MUX 504 is loaded into the FIFO memory device 506, whereas the input to the RD input terminal controls when the FIFO memory device 506 outputs data.

DPG

Figure 6:
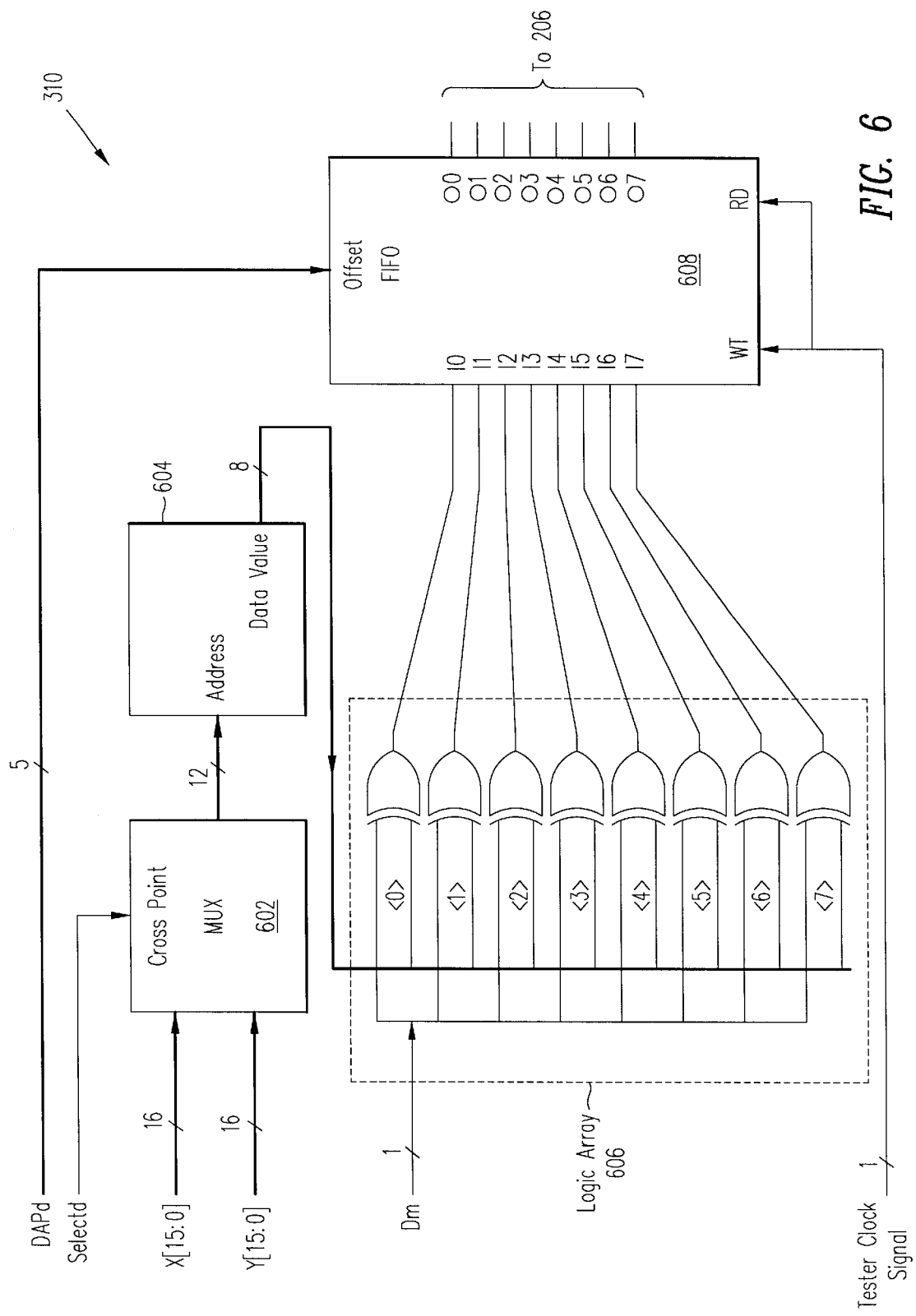
FIG. 6 depicts an embodiment of a portion of DPG of FIG. 3.

FIG. 6 in a combination schematic and block diagram depicts an embodiment of a DPG 310 for a single bit of the M bits of data from APG 304. For each bit of the M bits of data from APG 304, there is an associated distinct replica of DPG 310. When DUT 202 is a Direct RDRAM™ memory device, M is 18 in order to generate two 9 streams that correspond to commands "DQA" and "DQB".

Note that the M replicas of DPG 310 provide parallel ordered versions of streams of command "DQA" or "DQB" to the timing and formatting circuitry 206. The timing and formatting circuitry 206 converts the parallel ordered versions of the streams into serial order and thereby outputs command "DQA" or "DQB".

Advantageously, the DPG 310 increases the speed that data is output above that at which the APG 304 provides data. Thereby multiple, speed enhanced APGs are not needed.

DPG 310-n includes a conventional cross point multiplexer 602 that is coupled to receive inputs of row and column addresses output from the APG 304. Instruction SELECTd from the controller 204 (FIG. 2) controls the cross point multiplexer 602. The cross point multiplexer 602 provides its output signal to a data memory 604.

Figure 1A:
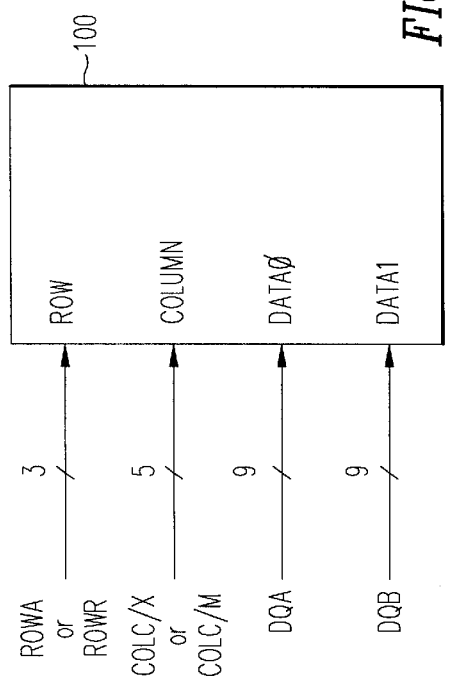
FIG. 1A depicts a sample memory device under test (DUT).
Figure 1C:
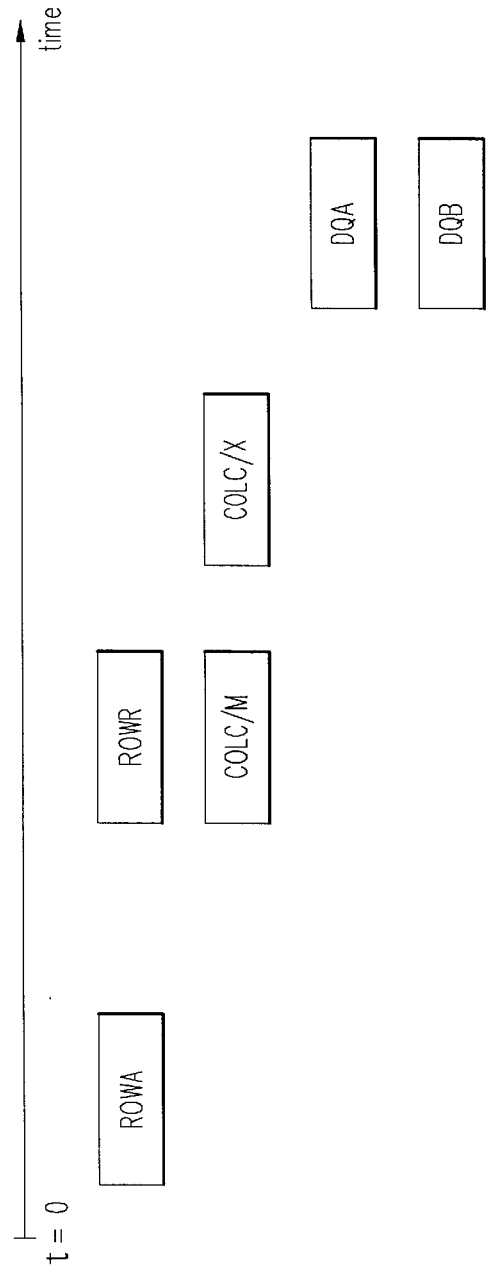
FIG. 1C depicts an exemplary sequence of packet-based commands.

The memory 604 stores a table of associations between data values and column and row addresses. Memory 604 is a conventional memory such as a static random access memory (SRAM) that is readily addressable. Memory 604 uses the column and row addresses from the APG 304 to look up a data value and provides the data value to logic array 606. Such associations between column and row addresses and data values are readily programmable by the controller 204 of FIG. 1.

Logic array 606 generates a multibit data value from a combination of the data value output from the data memory 604 and a single bit $D_m$ of the M data bits from APG 304. The logic array 606 includes N logic gates, each logic gate being a XOR type.

In this embodiment, each of the N logic gates is coupled to receive A) a distinct bit of the data value from the data memory 604 and B) a single bit Dm of the M data bits from APG 304. Each of the N logic gates generates an output bit by XORing the A) and B) input bits. Thus the logic array 606 generates N bits from each bit of the M data bits from APG 304, where N is 8 in this embodiment.

The N bit output from logic array 606 is provided to a conventional first-in-first-out (FIFO) memory device 608. Instruction DAPd specifies the number of clock cycles (offset) of the tester clock signal of tester clock 210 (FIG. 2) to count prior to outputting the N bits from logic array 606. The tester clock signal is coupled to input terminals WT and RD of the FIFO memory device 608. The signal input to the WT terminal controls when the N bit output from the logic array 606 is loaded into the FIFO memory device 608, whereas the signal input to the RD input terminal controls when the FIFO memory device 608 outputs an N bit output.

The timing and formatting circuitry 206 converts the N bits output from FIFO memory device 608 into a serial ordered bit stream of N bits. Where the memory DUT 202 is a Direct RDRAM™, N is 8, and each 8-bit output from FIFO memory device 608 corresponds to a single stream of a packet-based data command, e.g., either "DQA" or "DQB".

Thus by use of logic array 606, test system 200 generates data at a bit rate higher than that achievable by use of APG 304 alone. For example, if the APG 304 outputs data at a rate of 10 megabits/second, and the memory DUT 202 requires a data input at a rate of 80 megabits/second, DPG 310 is used to increase the rate at which data is input to the memory DUT 202. The logic array 606 multiplies the bit rate at which data is output by the APG 304 by N fold, where N is the number of logic gates and corresponding output bits from the logic array 606.

Modifications

All parameters provided herein are exemplary. The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true scope of this invention.

What is claimed is:

1. A packet generator that generates packet-based address and data commands to a device under test (DUT), the packet generator comprising:

an algorithmic pattern generator (APG) that provides data at a data rate and provides addresses at an address rate;

a packet control memory (PCM) that stores user-specified instructions and that outputs user-specified instructions based on controls from the APG;

a controller coupled to the APG and PCM;

an address generator that is coupled to receive the addresses from the APG and the user-specified instructions from the PCM, wherein the address generator outputs address packets including the address and the user-specified instructions at a rate faster than the address rate wherein each address comprises a row and column address;

a data packet generator (DPG) coupled to receive the user-specified instructions from the PCM and the data and addresses from the APG, wherein the DPG outputs data packets including the data and the user-specified instructions at a rate faster than the data rate; wherein the address generator further comprises:

a row packet generator (RPG) coupled to receive the row address from the APG and the user-specified instructions from the PCM, wherein the RPG outputs row packets including the row address and the user-specified instructions; and a column packet generator (CPG) coupled to receive the column address from the APG and the user-specified instructions from the PCM, wherein the CPG outputs column packets including the column address and the user-sdecified instructions;

wherein the RPG comprises first and second cross point multiplexers each coupled to receive the row address from the APG and the user-specified instructions from the PCM, wherein the output of each of the first and second cross point multiplexers is selected by the controller and wherein the output signal of each of the first and second cross point multiplexers is a packet which includes a row address;

a multiplexer coupled to receive output signals from each of the first and second cross point multiplexers, wherein the multiplexer outputs either the output signal from the first or second cross point multiplexer in response to an instruction from the controller; and a FIFO memory coupled to receive the output from the multiplexer, wherein the controller provides a delay signal to the FIFO memory to delay the output of the row address packet.

2. A packet generator that generates packet-based address and data commands to a device under test (DUT), the packet generator comprising:

an algorithmic pattern generator (APG) that provides data at a data rate and provides addresses at an address rate;

a packet control memory (PCM) that stores user-specified instructions and that outputs user-specified instructions based on controls from the APG;

a controller coupled to the APG and PCM;

an address generator that is coupled to receive the addresses from the APG and the user-specified instructions from the PCM, wherein the address generator outputs address packets including the address and the user-specified instructions at a rate faster than the address rate wherein each address comprises a row and column address and wherein the address generator further comprises:

a row packet generator (RPG) coupled to receive the row address from the APG and the user-specified instructions from the PCM, wherein the RPG outputs row packets including the row address and the user-specified instructions;

a column packet generator (CPG) coupled to receive the column address from the APG and the user-specified instructions from the PCM, wherein the CPG outputs column packets including the column address and the user-specified instructions;

a data packet generator (DPG) coupled to receive the user-specified instructions from the PCM and the data and addresses from the APG, wherein the DPG outputs data packets including the data and the user-specified instructions at a rate faster than the data rate;

wherein the CPG comprises:

first and second cross point multiplexers each coupled to receive the column address from the APG and the user-specified instructions from the PCM, wherein the output signal of each of the first and second cross point multiplexers is selected by the controller and wherein the output signal of each of the first and second cross point multiplexers is a packet which includes a column address;

a multiplexer coupled to receive output signals from each of the first and second cross point multiplexers, wherein the multiplexer outputs either the output signal from the first or second cross point multiplexer in response to an instruction from the controller; and a FIFO memory coupled to receive the output signal from the multiplexer, wherein the controller provides a delay signal to delay the output of the column address packet.

3. A packet generator that generates packet-based address and data commands to a device under test (DUT), the packet generator comprising:

an algorithmic pattern generator (APG) that provides data at a data rate and provides addresses at an address rate;

a packet control memory (PCM) that stores user-specified instructions and that outputs user-specified instructions based on controls from the APG;

an address generator that is coupled to receive the addresses from the APG and the user-specified instructions from the PCM, wherein the address generator outputs address packets including the address and the user-specified instructions at a rate faster than the address rate;

a data packet generator (DPG) coupled to receive the user-specified instructions from the PCM and the data and addresses from the APG, wherein the DPG outputs data packets including the data and the user-specified instructions at a rate faster than the data rate;

a cross point multiplexer coupled to receive the address from the APG, wherein the cross point multiplexer outputs an address value;

a memory device coupled to receive the address value from the cross point multiplexer, wherein the memory device generates a data value;

a logic array coupled to receive the data value from the memory device and a data bit of the data from the APG, wherein the logic array outputs a data packet; and a FIFO memory coupled to receive the data packet, wherein the controller device provides a delay signal to delay the output of the data packet.

* * * * *